United States Patent [19]

De Shazo, Jr.

[11] Patent Number: 4,785,339
[45] Date of Patent: Nov. 15, 1988

[54] INTEGRATED LATERAL PNP TRANSISTOR AND CURRENT LIMITING RESISTOR

[75] Inventor: Thomas R. De Shazo, Jr., Kingwood Township, Hunterdon County, N.J.

[73] Assignee: GE Solid State Patents, Inc., Somerville, N.J.

[21] Appl. No.: 915,985

[22] Filed: Oct. 3, 1986

[51] Int. Cl.[4] .................. H01L 29/72; H01L 29/06
[52] U.S. Cl. .................. 357/35; 357/23.13; 357/46; 357/51
[58] Field of Search .................. 357/51, 35, 46, 23.13

[56] References Cited

U.S. PATENT DOCUMENTS

| | | | |
|---|---|---|---|
| 3,341,754 | 9/1967 | Kellett et al. | 357/51 |
| 3,363,154 | 1/1968 | Haas | 357/51 |
| 3,502,952 | 3/1970 | Hierholzer, Jr. | 317/235 |
| 3,673,428 | 6/1972 | Athanas | 357/23.13 |
| 4,100,565 | 7/1978 | Khajezadeh | 357/35 |
| 4,656,491 | 4/1987 | Igarashi | 357/51 |

Primary Examiner—Andrew J. James
Assistant Examiner—Jerome Jackson, Jr.
Attorney, Agent, or Firm—Stanley C. Corwin; Kenneth R. Glick

[57] ABSTRACT

A PNP transistor and a current limiting resistor are formed in a single active region of an integrated circuit device. The resistor is arranged to limit current flow between the emitter and collector regions of the transistor upon breakdown of the PN junctions due to momentary high voltage.

14 Claims, 1 Drawing Sheet

INTEGRATED LATERAL PNP TRANSISTOR AND CURRENT LIMITING RESISTOR

The present invention relates to resistive structure for limiting current flow through lateral PNP transistors should junction breakdown occur due to momentary high voltage.

BACKGROUND OF THE INVENTION

Lateral PNP transistors which are used in applications where high voltages exist between their emitters and collectors may experience junction breakdown under certain conditions. If a low impedance path exists from the collector to ground, large currents will flow which may cause damage to the transistor as well as related circuitry. To avoid this problem, circuit designers usually provide a resistor in series with the collector of the PNP transistor and the circuitry to which it attaches. This resistor is normally placed in a separate isolated active region adjacent, or in proximity to, the active region containing the PNP transistor. This of course requires a separate active region having appropriate bias and interconnecting metalization which occupies chip space in addition to that required for the PNP transistor. What is needed is a means for lmiting current flow through a PNP transistor which does not require additional chip space or interconnecting metalization.

SUMMARY OF THE INVENTION

The present invention includes a lateral PNP transistor and a means for limiting current flow through the transistor, both arranged within a single isolated active region of an integrated circuit device. The PNP transistor has emitter, base, and collector regions with PN junctions therebetween. Upon breakdown of the PN junctions due to momentary high voltage, the means limits the flow of current through the transistor.

DESCRIPTION OF THE PREFERRED EMBODIMENT

Figure 1:
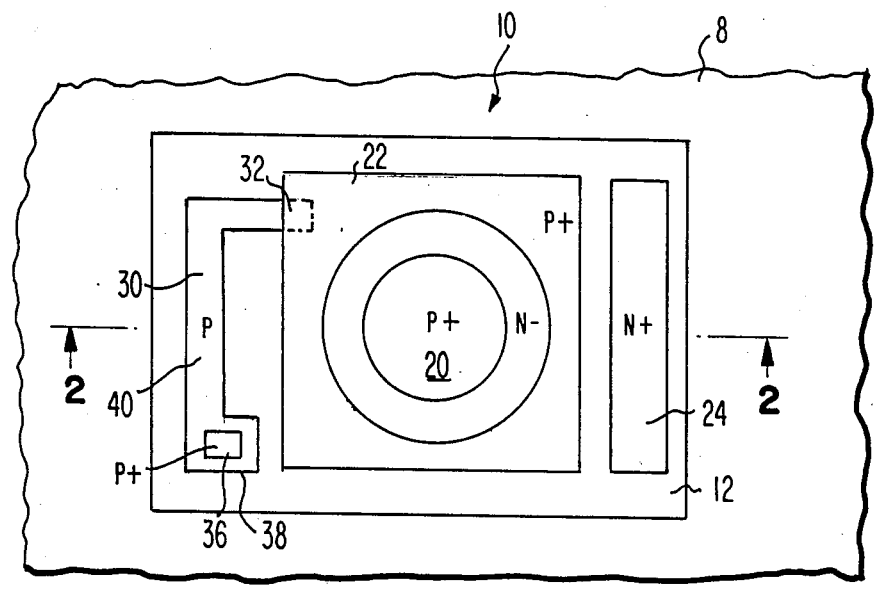
FIG. 1 is a plan view of an integrated circuit device showing an active region containing a PNP transistor and a current limiting resistor in accordance with the teachings of the present invention.
Figure 2:
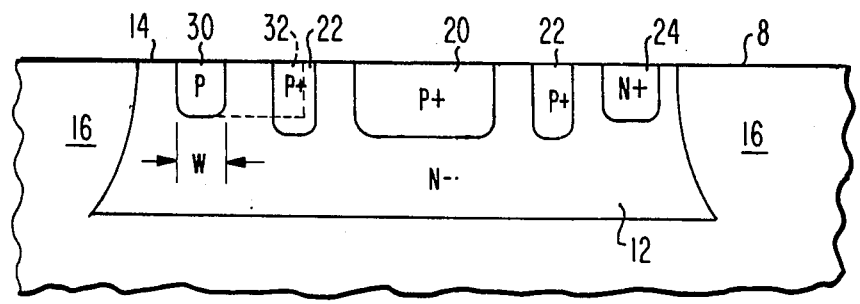
FIG. 2 is a partial cross-sectional view taken along the lines 2—2 of FIG. 1.

There is shown in FIGS. 1 and 2 a portion of an intergrated circuit device 8 including a lateral PNP bipolar transistor 10. The transistor 10 is arranged in a body or active region 12 of semiconducting material which is lightly doped N type conductivity and has a surface 14. The active region 12 is isolated from other active regions on the integrated circuit device 8 by any usual means such as by thick oxide regions 16, trench isolation, or alternatively the active region 12 may be an individual island. An emitter region 20 of highly doped P+ type conductivity is arranged within the ative region 12 and extends downwardly from the surface 14, as viewed in FIG. 2. A collector region 22 of highly doped P+ type conductivity is arranged within the active region 12, completely surrounding but spaced from the emitter region 20. The region 22 extends downwardly from the surface 14, as viewed in FIG. 2. While, in the present example, the collector region 22 completely surrounds the emitter region 20, other collector structures may be utilized which do not surround the emitter. A base contact region 24 of highly doped N+ type conductivity is disposed in the active region 12 at the surface 14, as shown in FIGS. 1 and 2.

A resistive region 30 of P type conductivity is arranged within the active region 12, spaced from the collector region 22. An end 32 of the resistive region 30 overlaps and merges with a portion of the collector region 22 so that good electrical continuity exists between the resistive region 30 and the collector region 22. A contact region 36 of highly doped P+ type conductivity is disposed in the resistive region 30 at the surface 14 and is arranged at an end 38 which is spaced from the end 32. The portion of the resistive region 30, which lies between the end 32 and the contact region 36, constitutes a resistor element 40.

The emitter and collector regions 20 and 22 are typically doped with boron impurities to obtain a sheet resistivity of from about 40 to about 65 ohms per square. The resistor element 40, on the other hand, has a relatively lower doping level which results in a resistivity of from about 105 to about 103 ohms per square. By appropriately controlling the width and length of the reistor element 40, a specific desired resistance can be obtained which would function to limit current flow between the emitter 20 and collector 22 of the transistor 10 and the circuit to which it is attached. In the present example, the resistor element 40 extends downwardly from the surface 14 to a depth of about 3.6 microns, has a width W of about 10 microns, as seen in FIG. 2, and has a total electrical length from the end 32 to the contact region 36 of about 100 microns. This results in a resistor element of about 1150 ohms in series with the collector 22 of the transistor 10. Both the resistor element 40 and the transistor 10 are contained completely within the active region 12.

The transistor 10 and associated series resistor element 40 can be made utilizing materials and methods that are well known in the art. For example, the active region 12 may be an epitaxial layer formed on a substrate in the usual manner. The emitter and collector regions 20 and 22 respectively may be diffused with P type conductivity determining impurities to obtain the desired sheet resistance. The resistive region 30 is formed after the formation of the collector region 22 by diffusion with P type conductivity determining impurities to provide a sheet resistivity of about 105 to about 130 ohms per square. The end 32 of the region 30 should sufficiently overlap the collector region 22 to assure good electrical continuity between the two regions 22 and 30. The N+ base contact region 24 and the P+ resistor contact region 36 are formed in the usual manner and serve only to assure ohmic contact between their respective regions and circuit conductors.

A very important advantage of the present invention is that a PNP transistor and current limiting resistor may be formed in the same active region on an integrated circuit chip thereby saving chip space and reducing the number of required interdevice conductors. The current limiting resistor is arranged in series with the collector of the PNP transistor and circuitry to which the transistor is attached, as described herein. This arrangement will limit current flow between the emitter and collector regions of the transistor upon breakdown of the PN junctions of the transistor due to momentary high voltage.

I claim:

1. A lateral PNP transistor having emitter, base, and collector regions with PN junctions therebetween, including a collector contact and a resistor region arranged so that said resistor region extends contiguously between said collector contact and said collector region, said transistor and said resistor region being in a single active region, wherein said resistor region has a first sheet resistivity and said emitter and collector regions have a second sheet resistivity, said second sheet resistivity being diffent from said first sheet resistivity.

2. The device set forth in claim 1 wherein said resistor region has a resistance of from about 500 ohms to about 5000 ohms between said collector contact and said collector region.

3. In an integrated circuit device including a body of semiconducting material having a surface, an active region of N type conductivity in said body extending inwardly from said surface, a lateral PNP transistor in said active region comprising an emitter region of P type conductivity extending inwardly from said surface, a collector region of P type conductivity extending inwardly from said surface but spaced from said emitter region, said emitter and collector regions having a first sheet resistivity; and a resistor region of P type conductivity having a second sheet resistivity different from said first sheet resistivity, contiguous with the collector region, said emitter, collector and resistor regions forming PN junctions with said active region.

4. The device set forth in claim 1 wherein said emitter and collector regions have a sheet resistivity of from about 40 ohms per square to about 65 ohms per square and said resistor region has a sheet resistivity of from about 105 ohms per squre to about 130 ohms per square.

5. The device set forth in claim 4 wherein a first portion of said resistor region is in contact with said collector region and a second portion of said resistor region, spaced from said first portion, includes an ohmic contact.

6. The device set forth in claim 5 wherein said resistor region has a resistance of from about 500 ohms to about 5000 ohms between said first and second portions.

7. A lateral PNP transistor comprising:
a body of N type semiconductor material having a surface;
an emitter region of P type conductivity extending into the body from the surface so as to form a PN junction;
a collector region of P type conductivity extending into the body from the surface so as to form a PN junction, the collector region being spaced from the emitter region so as to define an active N type base region, the emitter and collector regions having a predetermined sheet resistivity; and
a resistor region of P type conductivity extending into the body from the surface and being spaced from the emitter region, the resistor region having a sheet resistivity different from that of the collector region, a first end that is contiguous with the collector region and a second end that includes a collector contact thereto, so as to provide a predetermined resistance between said first and second ends.

8. A transistor in accordance with claim 7 wherein:
the collector region surrounds the emitter region.

9. The device set forth in claim 7 wherein said emitter and collector regions have a sheet resistivity of from about 40 ohms per square to about 65 ohms per square and said resistor region has a sheet resistivity of from about 105 ohms per square to about 130 ohms per square.

10. The device set forth in claim 9 wherein a first portion of said resistor region is in contact with said collector region and a second portion of said resistor region, spaced from said first portion, includes an ohmic contact.

11. The device set forth in claim 10 wherein said resistor region has a resistance of from about 500 ohms to about 5000 ohms between said first and second portions.

12. The device set forth in claim 3 wherein said emitter and collector regions have a sheet resistivity of from about 40 ohms per square to about 65 ohms per square and said resistor region has a sheet resistivity of from about 105 ohms per square to about 130 ohms per square.

13. The device set forth in claim 12 wherein a first portion of said resistor region is in contact with said collector region and a second portion of said resistor region, spaced from said first portion, includes an ohmic contact.

14. The device set forth in claim 13 wherein said resistor region has a resistance of from about 500 ohms to about 5000 ohms between said first and second portions.

* * * * *